US006922066B2

(12) United States Patent
Hidaka

(10) Patent No.: US 6,922,066 B2
(45) Date of Patent: Jul. 26, 2005

(54) SAMPLER AND METHOD OF MEASURING A WAVEFORM OF A CURRENT WITH JITTERS REDUCED

(75) Inventor: Mutsuo Hidaka, Tokyo (JP)

(73) Assignees: NEC Corporation, Tokyo (JP); International Superconductivity Technology Center, Tokyo (JP)

( * ) Notice: Subject to any disclaimer, the term of this patent is extended or adjusted under 35 U.S.C. 154(b) by 69 days.

(21) Appl. No.: 10/195,825

(22) Filed: Jul. 16, 2002

(65) Prior Publication Data

US 2003/0028338 A1 Feb. 6, 2003

(30) Foreign Application Priority Data

Jul. 17, 2001 (JP) ........................................ 2001-216696

(51) Int. Cl.[7] ........................ G01R 27/08; G01R 13/34
(52) U.S. Cl. ..................................... 324/713; 324/76.42
(58) Field of Search ............................ 324/76.13, 76.15, 324/76.24, 76.38, 76.42, 76.58, 713, 691, 649, 600, 117 R, 750, 753, 765, 529, 248, 252, 71.6, 76.11, 85; 714/733, 734; 505/160, 162, 190, 193

(56) References Cited

U.S. PATENT DOCUMENTS

| | | | | |
|---|---|---|---|---|
| 4,533,840 A | * | 8/1985 | Gheewala et al. | .......... 327/367 |
| 4,855,895 A | * | 8/1989 | Shigaki et al. | ............... 363/157 |
| 5,162,723 A | * | 11/1992 | Marzalek et al. | ........ 324/76.19 |
| 5,179,729 A | * | 1/1993 | Mishima et al. | ............ 455/260 |
| 5,191,236 A | * | 3/1993 | Ruby | ......................... 327/528 |
| 5,343,405 A | * | 8/1994 | Kucera et al. | ................. 702/73 |
| 5,457,990 A | * | 10/1995 | Oswald et al. | ............. 73/290 V |
| 6,118,284 A | * | 9/2000 | Ghoshal et al. | .............. 324/750 |
| 6,331,805 B1 | * | 12/2001 | Gupta et al. | .............. 331/107 S |
| 6,420,895 B1 | * | 7/2002 | Herr et al. | ...................... 326/3 |
| 6,483,287 B2 | * | 11/2002 | Otsubo et al. | ............ 324/76.39 |
| 6,509,853 B2 | * | 1/2003 | Gupta | ......................... 341/133 |
| 6,580,310 B2 | * | 6/2003 | Herr | ............................ 327/528 |
| 6,650,101 B2 | * | 11/2003 | MacDonald et al. | ...... 324/76.24 |

OTHER PUBLICATIONS

M. Hidaka et al., "High–resolution Measurement by a High–$T_c$ Superconductor Sampler", IEEE Transactions on Applied Superconductivity, vol. 9, No. 2, (Jun. 1999), pp. 4081.

IEEE Transactions on Applied Semiconductivity, vol. 1, No. 1, (Mar. 1991).

D. Gupta et al., "Applied Physics Letters", vol. 76, No. 25, (Jun. 19, 2000), pp. 3820.

* cited by examiner

*Primary Examiner*—Anjan Deb
*Assistant Examiner*—Hoai-An D. Nguyen
(74) *Attorney, Agent, or Firm*—Sughrue Mion, PLLC

(57) ABSTRACT

In a sampler for use in measuring a waveform of an electric signal, a measurement target current is given as the electric signal to a sampler chip 11 and is also used to produce a trigger current Itr for determining measurement timing on the sampler chip. A comparator 20 compares a sum of a feedback current, a current derived from the measurement target current, and the trigger current Itr with a threshold value to produce an SFQ pulse when the sum exceeds the threshold value. The SFQ pulse produced by the comparator is observed or counted for a predetermined duration to measure the waveform of the electric signal.

15 Claims, 11 Drawing Sheets

SAMPLER AND METHOD OF MEASURING A WAVEFORM OF A CURRENT WITH JITTERS REDUCED

BACKGROUND OF THE INVENTION

This invention relates to a sampler and a method for measuring a waveform of an electric signal repeatedly generated and, in particular, to the sampler and the method which uses a superconductor to measure the waveform with a high time resolution.

In general, a sampler of the type described has been conventionally used to measure a waveform of a current that flow through a wiring on a semiconductor chip of an LSI and the like. In this connection, the current flowing through the wiring may be called a measurement target current while the wiring may be called a measurement target. Such a conventional sampler has been disclosed, for example, in IEEE Transactions on Applied Superconductivity Vol. 9, No.2, June 1999 (page 4081) and is effective to measure the measurement target current caused to flow through the wiring of the LSI that has a complicated pattern and an unknown impedance. The sampler is also advantageous in that the waveform of the measurement target current can be measured without contacting with the measurement target.

More specifically, the conventional sampler has a plurality of Josephson junctions operable in a superconducting state and may be referred to as a superconductor sampler. In this event, the superconductor sampler is supplied with a feedback current controlled in its level during measurement and a trigger current of a pulse shape that defines measurement timing and that is successively varied. Under the circumstances, when the measurement target current is given to the sampler, a sum of the feedback, the trigger, and the measurement target currents is provided or calculated and is compared with a predetermined threshold level. With this structure, it is possible to measure the waveform of the measurement target current by successively varying a value or level of the feedback current and generation timing of the trigger current.

Herein, the superconductor sampler is expected to have a high time resolution and should have generally a bandwidth of more than 100 GHz. In order to observe such a high frequency, such as 100 GHz, it is required that jitters must be reduced to less than several picoseconds. In practice, the trigger current inevitably fluctuates by about 40 picoseconds due to thermal noise. As a result, it has been found out that such a requirement can be never achieved in the conventional superconductor sampler.

In addition, it takes a long time to measure the waveform with a high time resolution and with a high accuracy.

SUMMARY OF THE INVENTION

It is an object of this invention to provide a superconductor sampler which is capable of considerably reducing jitters that might take place during waveform measurement of a measurement target current.

It is another object of this invention to provide a super-conductor sampler of the type described, which is capable of raising a measurement frequency of a measurement target current so as to shorten a measurement time and to improve a degree of accuracy of the measurement.

It is still another object of this invention to provide superconductor sampler of the type described, which is inexpensive by using no expensive parts operable in a high frequency.

It is yet another object of this invention to provide a method of measuring a target current, which is capable of avoiding occurrence of jitters.

A sampler to which this invention is applicable is for use in measuring a waveform of an electric signal given as a measurement target signal. According to a first aspect of this invention, the sampler comprises branch means for branching the measurement target signal into first and second currents, generating means for generating a single flux quantum (SFQ) pulse in response to the first current, delay means for delaying the SFQ pulse by a controllable delay time to produce a delayed SFQ pulse as a trigger current, comparing means, responsive to the trigger current, the second current, and a feedback current, for conducting a switching operation in accordance with values of the second current and the feedback current each time when the trigger current is given, to produce an output pulse, post-frequency dividing means for frequency-dividing the output pulse into a frequency-divided pulse, and voltage converting means for converting the frequency-divided pulse into a converted voltage corresponding to the frequency-divided pulse. The waveform of the electric signal is measured on the basis of the converted voltage.

According to a second aspect of this invention, a sampler comprises branch means for branching the measurement target signal into first and second currents, generating means for generating a single flux quantum (SFQ) pulse in response to the first current, pre-frequency dividing means for frequency-dividing the SFQ pulse into a frequency-divided pulse, delay means for delaying the frequency-divided pulse by a controllable delay time to produce a frequency-divided and delayed pulse as a trigger current, comparing means, responsive to the trigger current, the second current, and a feedback current, for conducting a switching operation in accordance with values of the second and the feedback currents each time when the trigger current is given, to produce an output pulse, and voltage converting means for converting the output pulse produced by the comparing means into a converted voltage. Thus, the waveform of the electric signal is measured on the basis of the converted voltage.

According to a third aspect of this invention, a sampler comprises branch means for branching the measurement target current into first and second currents, generating means for an SFQ pulse in response to the first current, pre-frequency dividing means for frequency-dividing the SFQ pulse into a first frequency-divided pulse, delay means for delaying the first frequency-divided pulse by a controllable delay time to produce a delayed frequency-divided pulse as a trigger current, comparing means, responsive to the trigger current, the second current, and the feedback current, for conducting a switching operation in accordance with values of the second and the feedback currents on reception of the trigger current to produce an output pulse obtained by the switching operation, post-frequency dividing means for frequency-dividing the output pulse into a second frequency-divided pulse, and voltage converting means for converting the second frequency-divided pulse into a converted voltage. The waveform of the electric signal is measured on the basis of the converted voltage.

According to a fourth aspect of this invention, the post-frequency dividing means mentioned in the first or the third aspect is replaced by a counter for counting the output pulse.

According to a fifth aspect of this invention, the counter mentioned in the fourth aspect outputs only an upper part of predetermined bits selected from whole output bits.

According to a sixth aspect of this invention, the sampler mentioned in any one of the first through the fifth aspects is featured by the fact that the branch means, the SFQ generating means, the delay means, the comparing means, the pre-frequency dividing means, the post-frequency dividing means, the voltage converting means, and the counter constitute a sampler circuit and are formed in a single chip.

According to a seventh aspect of this invention, the sampler mentioned in the sixth aspect is featured by the fact that the pre-frequency dividing means, the post-frequency dividing means, and the counter are structured by SFQ toggle flip flops (TFF).

According to an eighth aspect of this invention, the sampler mentioned in the seventh aspect is featured by the fact that a whole or a part of the branch means, the SFQ pulse generating means, the delay means, the comparing means, the pre-frequency dividing means, the post-frequency dividing means, and the counter is constituted by a superconductor.

According to a ninth aspect of this invention, a sampler mentioned in the eighth aspect is featured by that fact that the superconductor is an oxide superconductor.

According to a tenth aspect of this invention, the comparing means mentioned in any one of the first through the ninth aspects includes a Josephson junction.

According to an eleventh aspect of this invention, the delay means mentioned in any one of the first through the ninth aspects comprises a Josephson transmission line (JTL) which includes a plurality of Josephson junctions and shunt resistors for shunting the Josephson junctions and which controls a propagation speed of the SFQ pulse by a bias current.

According to a twelfth aspect of this invention, the shunt resistors mentioned in the eleventh aspect have resistances smaller than a normal resistance of each Josephson junction.

According to a thirteenth aspect of this invention, the sampler mentioned in the eleventh aspect is specified by the fact that an additional JTL without any shunt resistor is disposed between the JTL with the shunt resistors and the comparing means.

According to a fourteenth aspect of this invention, a method is for use in measuring a waveform of an electric signal given as a measurement target current and comprises the steps of branching the measurement target current into first and second currents, generating an SFQ pulse in response to the first current, controlling a propagation time of the SFQ pulse to produce a controlled SFQ pulse as a trigger current, receiving the trigger current, the second current, and a feedback current to conduct a switching operation in accordance with values of the second and the feedback currents on reception of the trigger current and to produce an output pulse, frequency-dividing the output pulse obtained by the switching operation into a frequency-divided pulse, converting the frequency-divided pulse into a converted voltage, successively counting the SFQ pulse for a predetermined duration on the basis of the converted voltage, and repeating the above-mentioned steps with the propagation time successively varied.

According to a fifteenth aspect of this invention, a method is for use in measuring a waveform of an electric signal given as a measurement target current and comprises the steps of branching the measurement target current into first and second currents, generating an SFQ pulse in response to the first current, frequency-dividing the SFQ pulse into a frequency-divided pulse, controlling a propagation time of the frequency-divided pulse to produce a controlled frequency-divided pulse as a trigger pulse, receiving the trigger current, the second current, and a feedback current to conduct a switching operation in accordance with values of the second and the feedback currents on reception of the trigger current and to produce an output pulse as a result of the switching operation, converting the output pulse into a corresponding voltage, successively counting the SFQ pulse for a predetermined duration on the basis of the corresponding voltage, repeating the above-mentioned steps with the propagation time successively varied.

According to a sixteenth aspect of this invention, a method comprises the steps of branching the measurement target current into first and second currents, generating an SFQ pulse in response to the first current, frequency-dividing the SFQ pulse into a first frequency-divided pulse, controlling a propagation time of the first frequency-divided pulse to produce a controlled frequency-divided pulse as a trigger pulse, receiving the trigger current, the second current, and a feedback current to conduct a switching operation in accordance with values of the second and the feedback currents on reception of the trigger current and to produce an output pulse as a result of the switching operation, frequency-dividing the output pulse into a second frequency-divided pulse, converting the second frequency-divided pulse into a corresponding voltage, successively counting the SFQ pulse for a predetermined duration on the basis of the corresponding voltage, and repeating the above-mentioned steps by successively varying the propagation time to measure the waveform of the electric signal.

According to a seventeenth aspect of this invention, the method mentioned in the fourteenth or the sixteenth aspect further comprises the step of counting the SFQ pulse instead of the frequency-dividing step for obtaining the second frequency-divided pulse.

DESCRIPTION OF THE PREFERRED EMBODIMENTS

Prior Art

Figure 1A:
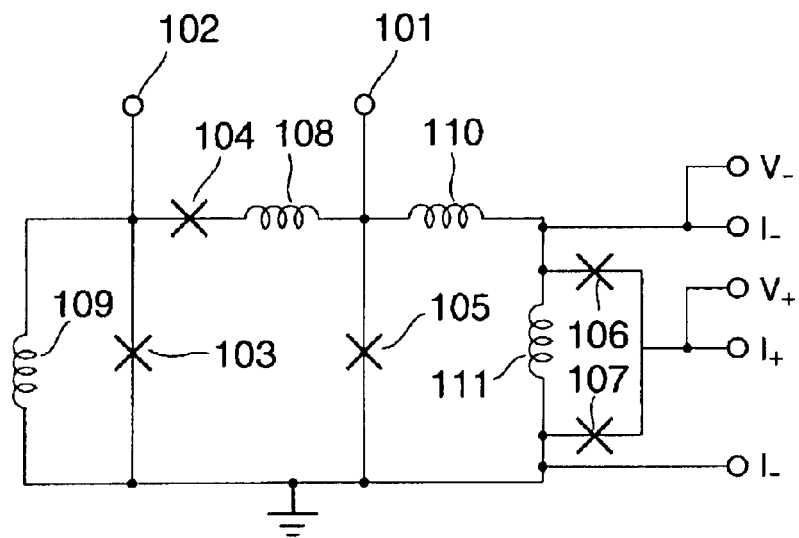
FIGS. 1A and 1B show a circuit diagram and a time chart for use in describing a conventional superconductor sampler circuit, respectively.
Figure 1B:
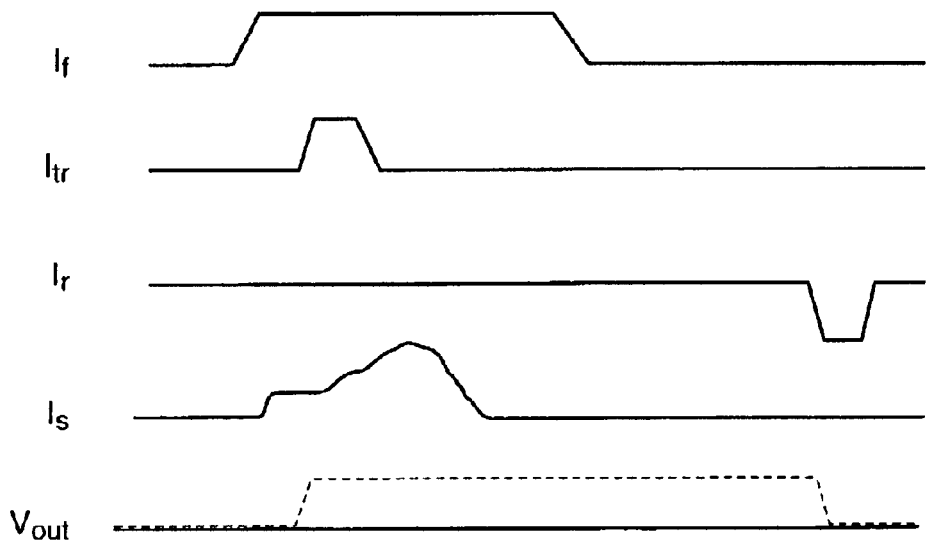

Referring to FIGS. 1A and 1B, description will be made about a conventional superconductor sampler that is equivalent to that illustrated in the above-referenced document, namely, IEEE Transactions on Applied Superconductivity, Vol.9, No.2, June 1999 (page 4081). The illustrated superconductor sampler is specified by a superconductor sampler circuit which has a high time resolution. The superconductor sampler is used to measure an unknown target current (to be measured) Is which is repeatedly varied quickly so that it can not be therefore measured by a usual ammeter. Such an unknown target current may be referred to as a measurement target current below. In other words, the superconductor sampler is operable as an electric signal waveform observation circuit. The superconductor sampler circuit illustrated in FIG. 1A will be described in detail with reference to FIG. 1B so as to facilitate a better understanding of this invention.

As shown in FIG. 1A, the superconductor sampler circuit has a first input terminal 101, a second input terminal 102, first through third Josephson junctions 103, 104, and 105, and first through third inductances 108, 109, and 111. In addition, a readout SQUID (Superconducitng Quantum Interference Device) is connected across the third inductance 111 which may be operable as a coupling inductance. The SQUID has fourth and fifth Josephson junctions 106 and 107.

With this structure, a feedback current If is at first given to the first input terminal 101, as shown along a top line of FIG. 1B and thereafter the unknown measurement target current Is is given to the first input terminal 101, as shown along a fourth line of FIG. 1B. Under the circumstances, when a trigger current Itr is caused to flow through the second input terminal 102 at certain timing, as shown along a second line of FIG. 1B, the first Josephson junction 103 is turned or switched into a voltage state. In this state, a Single Flux Quantum (SFQ) is entered into a first superconducting loop that is composed of the first Josephson junction 103, the second Josephson junction 104, the first inductance 108, and the third Josephson junction 105. As a result, a first superconducting circulation current is caused to flow through the first superconducting loop.

On the other hand, when the first Josephson junction 103 is switched, an SFQ is also entered in an opposite direction to that of the first superconducting loop into a second superconducting loop that includes the second inductance 109 and the first Josephson junction 103.

Now, it is assumed that the second Josephson junction 104 has a critical current value lower than the first superconducting circulation current. Under the circumstances, when the current exceeds the critical current value of the second Josephson junction 104, the second Josephson junction 104 is switched. In this case, a current that starts to flow through the second Josephson junction 104 due to the SFQ quickly falls down during a rise of the current. As a result, the SFQ exits through the first superconducting loop and an SFQ current pulse Ip (may be called an SFQ pulse or an SFQ pulse current) is caused to flow into the third Josephson junction 105.

On the other hand, the third Josephson junction 105 that is called a comparator junction is already given the feedback current If and the measurement target current Is and is further given the SFQ pulse current Ip. In consequence, the third Josephson junction 105 sums up the three currents, namely, the feedback current If, the measurement target current Is, and the SFQ pulse current Ip. If a sum of the above-mentioned currents exceeds a critical current value of the third Josephson junction 105, the third Josephson junction 105 is turned or switched. This causes a third superconducting circulation current to flow through a third superconducting loop that includes the third Josephson junction 105, the third inductance 110, and the coupling inductance 111 that serves to couple the readout SQUID (Superconducting Quantum Interference Device).

The third superconducting circulation current generates a voltage Vout across the SQUID formed by the fourth and the fifth Josephson junctions 106 and 107, as shown by a broken line along a bottom line of FIG. 1B.

On the other hand, when the sum of the above-mentioned three currents does not exceed the critical current value of the third Josephson junction 105 and the third Josephson junction 105 is not switched, no voltage is generated across the readout SQUID.

At an end of each measurement cycle, a negative reset current Ir is caused to flow through the first input terminal 101, as shown along a third line of FIG. 1B to reset the first and the third Josephson junctions 103 and 105.

The above-mentioned operations are repeated by changing the feedback current If to obtain a minimum value of the feedback current If at which the voltage Vout appears across the SQUID. The minimum feedback current value is compared with a smallest one of the feedback current If at which a voltage appears when Is=0. As a result, it is possible to detect the measurement target value Is at a time instant at which the pulse current Ip is generated.

Subsequently, timing of the trigger current Itr is successively varied from one to another to successively shift generation timing of the pulse current Ip. In this situation, similar measurements are repeated. Thus, a waveform of the measurement target current Is can be measured by the use of the superconductor sampler illustrated in FIG. 1A.

Figure 2:
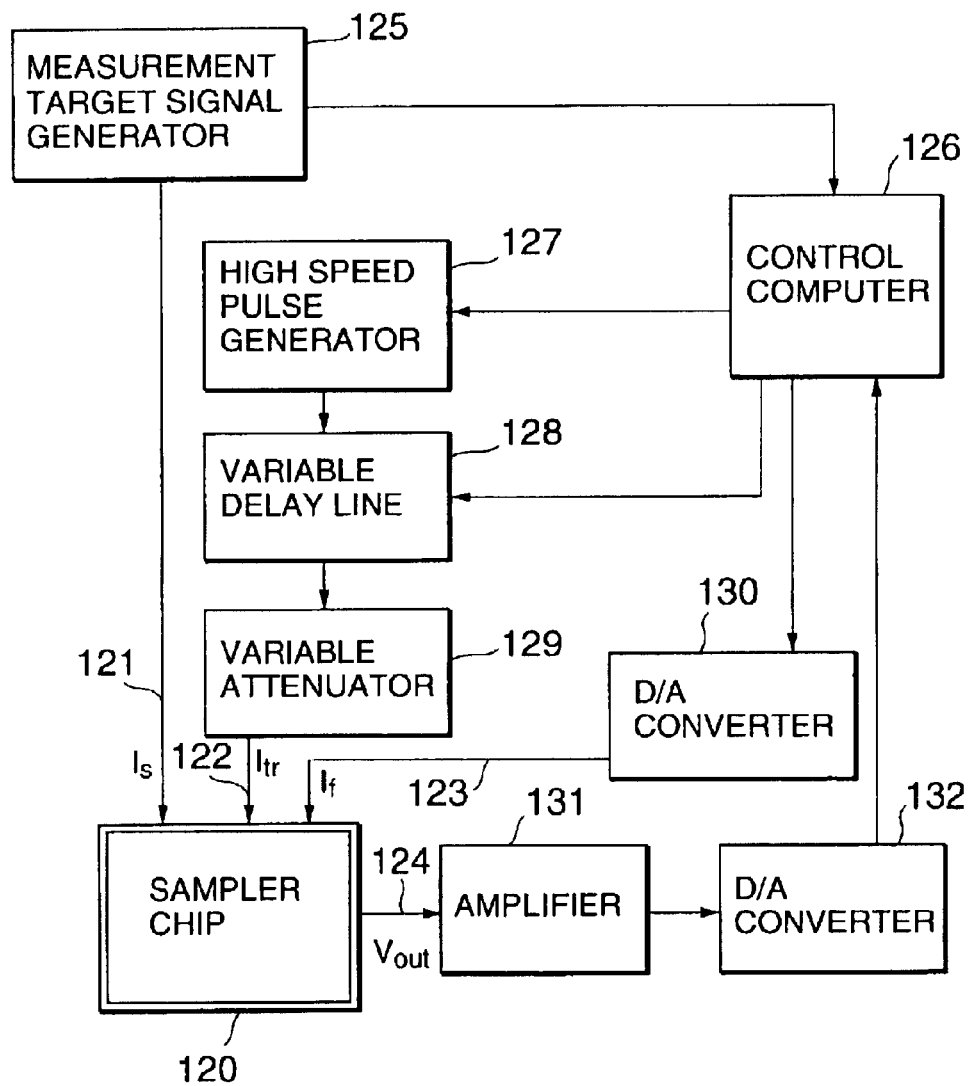
FIG. 2 shows a block diagram for describing the conventional superconductor sampler circuit and its peripheral circuit.

Referring to FIG. 2, the conventional superconductor sampler comprises a sampler chip 120 similar in structure to the superconductor sampler circuit illustrated in FIG. 1 and a peripheral circuit coupled to the sampler chip 120. The illustrated sampler chip 120 is kept at a low temperature at which the superconductor sampler circuit can be operated. Like in FIG. 1, the superconductor sampler circuit in the sampler chip 120 is given the measurement target current Is, the trigger current Itr, and the feedback current If through first, second, and third input lines 121, 122, and 123, respectively. In the illustrated example, the measurement target current Is is supplied from a measurement target signal generator 125 to the sampler chip 120 through the first input line 121 while the feedback current If and the trigger current Itr are supplied to the sampler chip 120 through the third and the second input lines 123 and 122 in a manner to be described later. At any rate, the trigger current Itr is given to the sampler chip 120 from the outside of the sampler chip 120.

The peripheral circuit of the superconductor sampler shown in FIG. 2 has a control computer 126 that monitors the measurement target signal generator 125. When the measurement target current Is is generated by the measurement target signal generator 125, the control computer 126 divides the measurement target current Is by a large division factor to produce a frequency-divided signal in synchronism with the measurement target current Is. The frequency-divided signal is sent from the control computer 126 to a high speed pulse generator 127. Responsive to the frequency-divided signal, the high speed pulse generator 127 generates a sequence of high speed pulses that have a high speed rise time of several tens of picoseconds and that are supplied to a variable delay line 128 controllable by the control computer 126.

The variable delay line 128 delays the high speed pulses by a time designated by the control computer 126 to supply delayed pulses to a variable attenuator 129. Thus, each delayed pulse is attenuated by the variable attenuator 129 into an attenuated pulse. The attenuated pulse has a magnitude adjusted by the attenuator 129 and is given to the sampler chip 120 as the trigger current Itr through the second input line 122.

On the other hand, the feedback current If is determined by the control computer 126 in a digital manner and is consequently represented by a digital value. The feedback current If is converted by a digital/analog (D/A) converter 130 into an analog value and is thereafter supplied from the D/A converter 130 through the third input line 123.

Supplied with the feedback current If, the trigger current Itr, and the measurement target current Is, the sampler chip 120 generates the pulse current Ip and the output voltage Vout determined by the pulse current Ip in the manner mentioned in conjunction with FIGS. 1A and 1B. The output voltage Vout is as large as 100 micro-volts or so and is amplified by an amplifier 131 by an amplification factor of about 1000 into an amplified voltage. The amplified voltage is converted by an A/D converter 132 into a digital value to be sent to the control computer 126 as a digital signal. The control computer 126 processes the digital signal in a predetermined manner to measure the measurement target current Is.

The moment the SFQ pulse Ip is entered into the third Josephson junction 105 (FIG. 1A) when the trigger current Itr is supplied to the sampler circuit and the first Josephson junction 103 is switched, the superconductor sampler executes the above-mentioned measurement. Herein, it is to be noted that only not longer than 1 picosecond is taken until the SFQ pulse is entered into the third Josephson junction 105 after its generation. This shows that measurement timing is influenced by both an arrival time of the trigger current Itr and a switching time of the first Josephson junction 103 after arrival of the trigger current Itr.

In the example illustrated in FIG. 2, the trigger current Itr is supplied to the sampler chip 120 from the peripheral circuit placed outside of the sampler chip 120. This shows that a time delay from about several picoseconds to several tens of picoseconds inevitably takes place until the trigger current Itr arrives at the sampler chip 120.

On the other hand, the trigger current Itr generated by the high speed pulse generator 127 has the rise time of about several tens of picoseconds and is transferred through the variable delay line 128 and the variable attenuator 129 to the sampler chip 120. While the trigger current Itr is passed through the variable delay line 128 and the variable attenuator 129, the rise time of the trigger current Itr often exceeds 100 picoseconds.

Moreover, the high speed pulse generator 127, the variable delay line 127, and the variable attenuator 129 should respond to each high speed pulse with the rise time of several tens of picoseconds and should be therefore structured by high frequency parts. Such high frequency parts are extremely high in cost, which raises a cost of the superconductor sampler.

In addition, it is known in the art that the critical current of the Josephson junction that acts as a threshold value fluctuates by an influence of a thermal noise. This shows that a slow rise time of the trigger current Itr gives rise to fluctuation of the switch timing of the first Josephson junction 103 due to the thermal noise.

For example, let a high-Tc superconductor sampler have a rise time of 200 picoseconds and operate at a temperature of 40K. In this event, it is estimated that the first Josephson junction 103 in such a superconductor sampler has a timing variation of about 40 picoseconds when it is switched on. Under the circumstances, it has been found out that a variation, namely, a jitter of the measuring timing takes place, resulting from the fact that the trigger current Itr is given from the outside of the sampler chip 120.

In the meanwhile, the superconductor sampler with a high time resolution would be generally expected to have a bandwidth of more than 100 GHz. In order to observe such a high frequency, such as 100 GHz, it is required that jitters must be reduced to less than several picoseconds. In practice, it has been found out that such a requirement can be never achieved by supplying the trigger current Itr to the sampler chip 120 from the outside thereof.

In principle, the superconductor sampler can measure a measurement target signal current Is that falls within a frequency band not lower than a gigahertz frequency band because it has a high time resolution. Herein, it is to be noted that the peripheral circuit except the sampler chip 120 includes a semiconductor device, such as the control computer 126, and the like, and can not execute a high speed operation in such a gigahertz frequency band. Especially, operation speeds of the amplifier 131 and the A/D converter 132 seriously act as bottlenecks. As a result, a measurement frequency presently accomplished by the superconductor sampler has been as low as 100 KHz or so. Furthermore, the variable delay line 128 needs a time of about 0.5 second to change a delay time from one to another.

In addition, trials should be repeated a large number of times, for example, 10000 times in the conventional superconductor sampler so as to measure a single point and must be executed a huge number of times so as to measure many points, such as 500 points, by slightly shifting a delay time from one to another. In this connection, a very long time of about several minutes is required to measure a single waveform.

A degree of accuracy of the measurement target current is proportional to a square root of averaged times carried out in the measurement. Under the circumstances, it is desired that a degree of accuracy is improved by raising the measurement frequency and by increasing the averaged times.

Embodiments of the Superconductor Samplers

Figure 3:
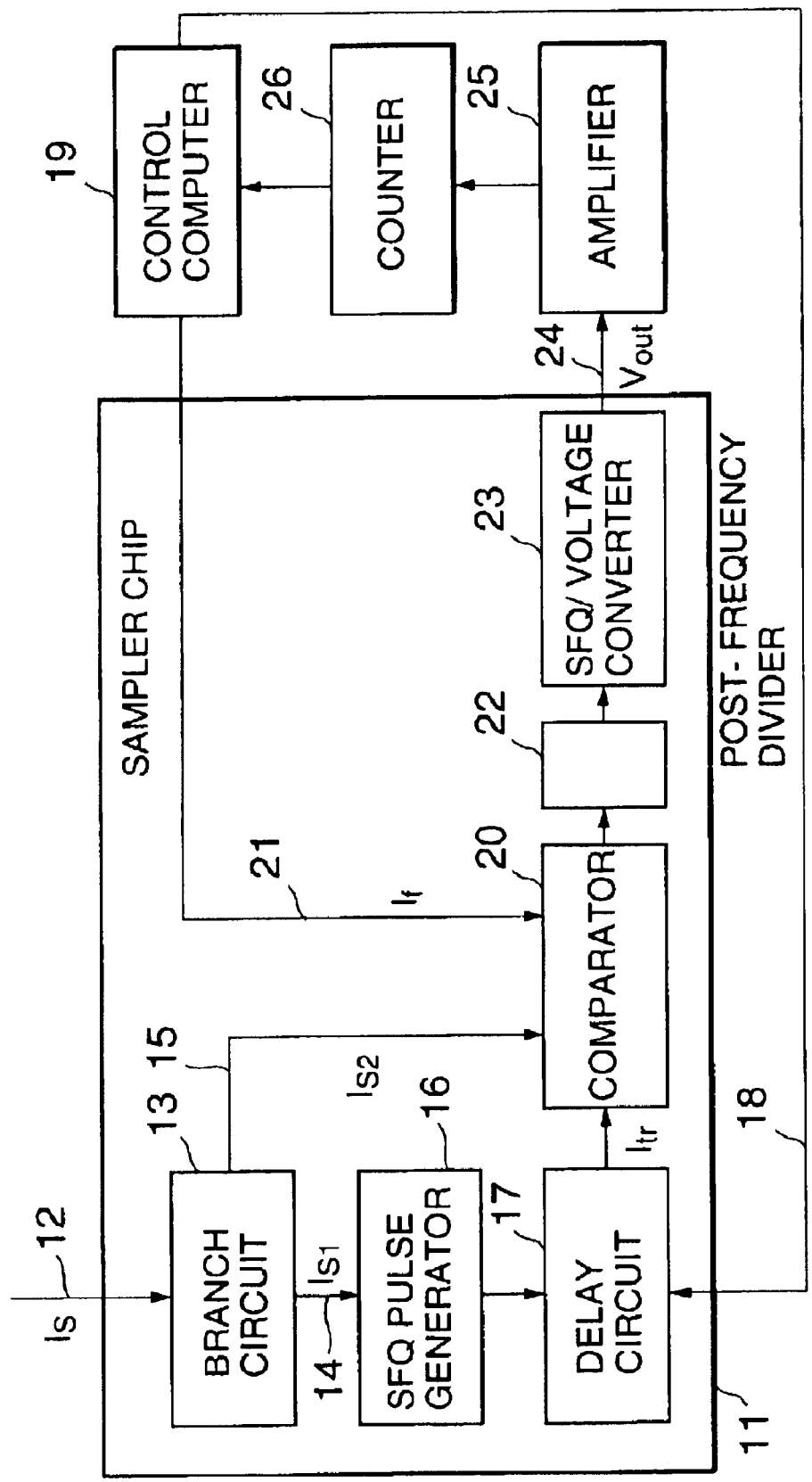
FIG. 3 shows a block diagram for use in describing a superconductor sampler according to a first embodiment of this invention.

Referring to FIG. 3, a superconductor sampler according to a first embodiment of this invention has a sampler chip 11 and a peripheral circuit except the sampler chip 11. On the sampler chip 11, a superconductor sampler circuit is formed which includes a branch circuit 13, an SFQ pulse generator 16, a delay circuit 17, a comparator 20, a post-frequency divider 22, and an SFQ/voltage converter 23. In the illustrated example, the sampler chip 11 according to this invention can be divided into the branch circuit 13 and the remaining elements in their operations and may be referred to as a branch unit and a processing unit, respectively. Stated otherwise, the remaining elements except the branch circuit 13 may be referred to as the processing unit for processing output signals of the branch circuit 13.

A measurement target current Is is generated by the measurement target signal generator 125 (shown in FIG. 2) and is sent to the sampler chip 11 through a first input line 12. In the illustrated sampler chip 11, the branch circuit 13 responds to the measurement target current Is and divides or branches it into a first current Is1 and a second current Is2 both of which are caused to flow through first and second current paths 14 and 15, respectively.

The first current Is1 is given through the first current path 14 to the SFQ pulse generator 16. A single SFQ pulse is generated by the SFQ pulse generator 16 and is delayed by the delay circuit 17 for a predetermined delay time and is thereafter delivered to the comparator 20 as a trigger current Itr of a pulse shape.

The delay time of the illustrated delay circuit 17 is determined by the control computer 19 and is transferred to the delay circuit 17 through a delay control line 18. This shows that a combination of the SFQ pulse generator 16 and the delay circuit 17 may be called a trigger current generating circuit.

The comparator 20 has a predetermined threshold current level and is connected to the branch circuit 13, the delay circuit 17, and the control computer 19. The illustrated comparator 20 is given the second current Is2 and the trigger current Itr from the branch circuit 13 and the delay circuit 17, respectively, and is also given the feedback current If through a feedback current path 21 from the control computer 19. The trigger current Itr, the second current Is2, and the feedback current If are summed up by the comparator 20 into a summed up current and are compared with the predetermined threshold current level by the comparator 20.

When the trigger current Itr is given to the comparator 20 and the summed up current exceeds the predetermined threshold current level, the comparator 20 generates a single SFQ pulse. The trigger current Itr has a function similar to the pulse current Ip mentioned in conjunction with the prior art.

Supplied with the SFQ pulse, the post-frequency divider 22 is located after the comparator 20 and frequency-divides the SFQ pulse into a frequency-divided signal that can be processed by the control computer 19 operated in a room temperature atmosphere. In other words, the post-frequency divider 22 has a frequency division factor such that the SFQ pulse is frequency-converted into a frequency band such that the control computer 19 is operable in the room temperature.

The frequency-divided signal is sent to the SFQ/voltage converter 23 and is converted into a voltage which has a constant level and which is sent as an output voltage Vout through an output line 24 to the outside of the sampler chip 11. Thus, a combination of the post-frequency divider 22 and the SFQ/voltage converter 23 may be collectively called an output circuit for outputting the output voltage Vout in response to the SFQ pulse given from the comparator 20.

The output voltage Vout generated from the superconductor SFQ circuit in the sampler chip 11 is as small as several hundreds of micro-volts and is too low to be processed by the semiconductor devices operable in the room temperature atmosphere. Accordingly, the amplifier 25 amplifies the output voltage Vout into an amplified voltage of a desired level. The amplified voltage is counted by the counter 26. Thus, the SFQ pulse generated from the comparator 20 within a predetermined duration is measured in number. The count of the SFQ pulse is sent as a result of measurement to the control computer 19 and is compared with a predetermined expectation or expected value.

If the result of measurement is smaller than the predetermined expected value, the control computer 19 increases the value or level of the feedback current If and repeats the measurement again in the above-mentioned manner. On the other hand, if the result of measurement exceeds the predetermined expected value at a certain time instant, the control computer 19 compares the value of the feedback current If at that time instant with a minimum value of the feedback current If. In this case, the minimum value of the feedback current If is defined by a value of the feedback current If generated when the number of the SFQ pulse exceeds the expected value on the condition that the measurement target current Is is equal to zero. Thus, the value of the second current Is2 can be measured at a time instant determined by the delay circuit 17.

In addition, inasmuch as a ratio of the second current Is2 and the measurement target current Is is determined by the branch circuit 13 and is invariable, it is possible to detect the value of the measurement target current Is at the above-mentioned time instant on the basis of the value of the second current Is2.

Thereafter, similar measurement is repeated by varying the delay time of the delay circuit 17 and, as a result, the waveform of the measurement target current Is can be observed.

In the superconductor sampler according to the first embodiment of this invention, the trigger current Itr is generated on the sampler chip 11 on the basis of the measurement target current Is and is propagated to the comparator 20 in the form of the SFQ pulse that has a pulse width of several picoseconds. Therefore, the superconductor sampler is advantageous in that occurrence of jitters can be extremely reduced during the measurement.

Moreover, the measurement is carried out at each period of the measurement target current Is. As a result, a measurement frequency can be increased and, in other words, a measuring period can be very shortened. Therefore, it is possible to shorten the measurement time and to improve a measuring precision. In addition, the above-mentioned superconductor sampler is inexpensive because high frequency parts of high costs can be implemented by superconductor circuits.

Figure 4:
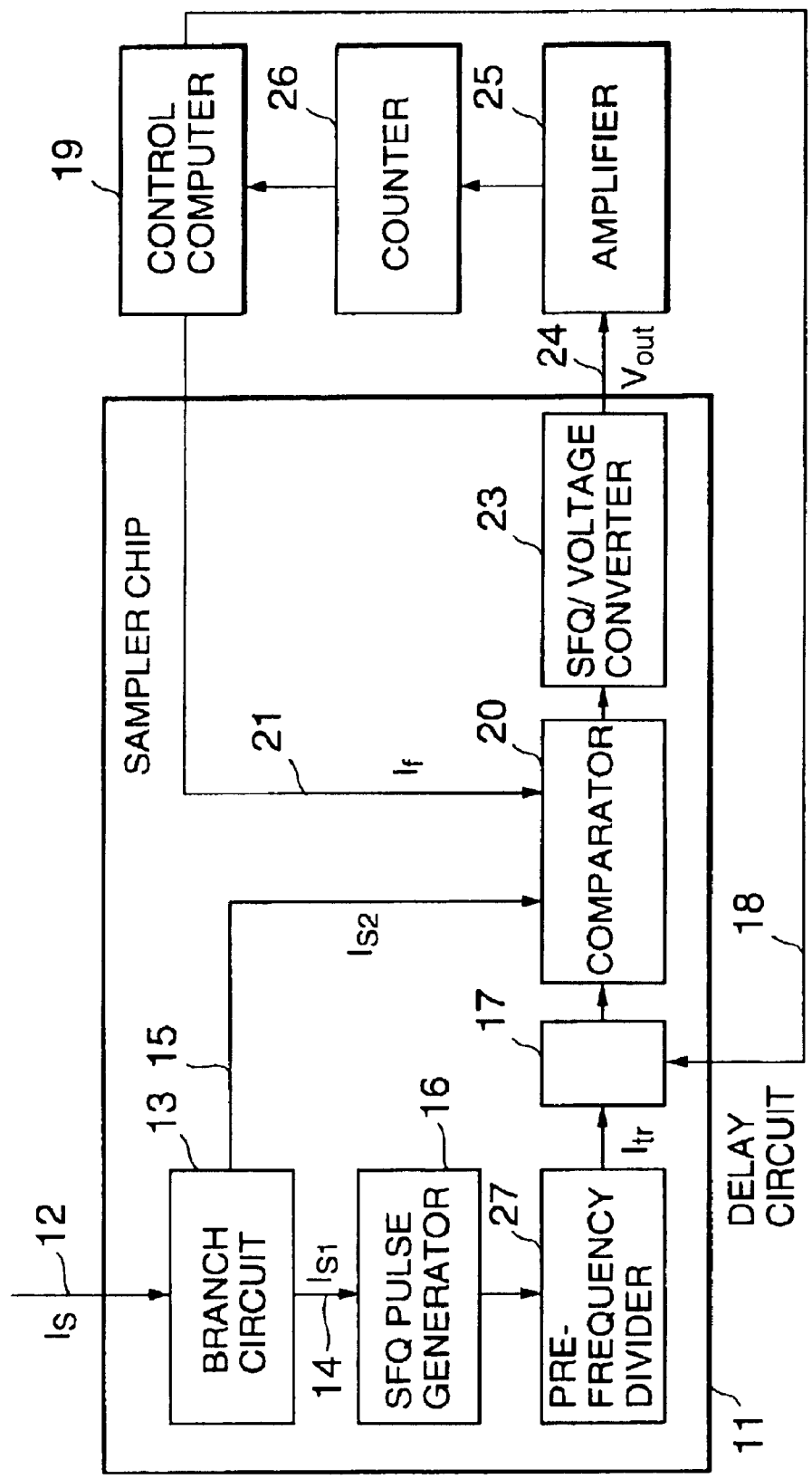
FIG. 4 shows a block diagram of a superconductor sampler according to a second embodiment of this invention.

Referring to FIG. 4, a superconductor sampler according to a second embodiment of this invention comprises similar parts that are designated by like reference numerals and that will not be described. In FIG. 4, it is to be noted that a pre-frequency divider 27 is located before the delay circuit 16 in a sampler chip 11a and, instead, the post-frequency divider 22 (FIG. 3) is omitted from FIG. 4. Specifically, the pre-frequency divider 27 is intermediate between the SFQ pulse generator 16 and the delay circuit 17 (namely, is located before the comparator 20) and frequency-divides the SFQ pulse sent from the SFQ pulse generator 16.

With this structure, the illustrated pre-frequency divider serves to reduce a frequency of occurrence of the trigger current Itr and, as a result, the output frequency of the comparator 20 can be lowered into a signal frequency that can be processed by semiconductor devices located in the room temperature atmosphere.

Since the trigger current Itr appears at a sufficiently low frequency of occurrence, a waveform can be observed for a long time by lengthening the delay time of the delay circuit 17 even when the measurement target current Is has a high frequency.

Although the delay circuit 17 is placed between the pre-frequency divider 27 and the comparator 20 in the illustrated example, it may be located before the pre-frequency divider 27, namely, between the SFQ pulse generator 16 and the pre-frequency divider 27.

In the second embodiment, the pre-frequency divider 27 is positioned before the comparator 20, as mentioned before. With this structure, it is possible to reduce the frequency of occurrence in the trigger current Itr, to lower the measurement jitters, and to realize the superconductor sampler at a low cost. In addition, a long-term observation of the waveform can be executed also.

Figure 5:
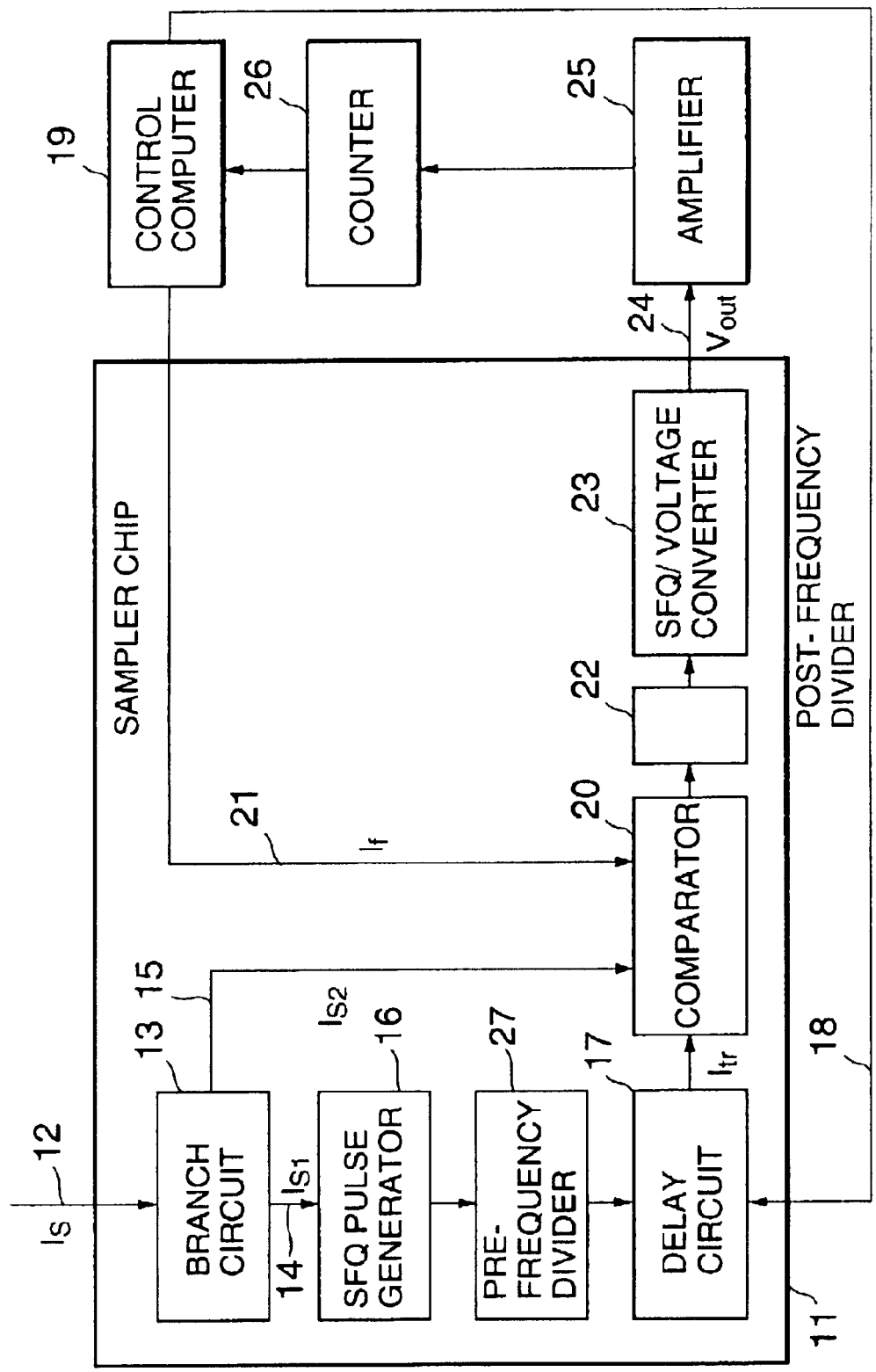
FIG. 5 shows a block diagram of a superconductor sampler according to a third embodiment of this invention.

Referring to FIG. 5, a superconductor sampler according to a third embodiment of this invention is similar in structure to that illustrated in FIG. 3 except that the pre-frequency divider 27 is also included together with the post-frequency divider 22 in the illustrated sampler chip 11b. Specifically, the pre-frequency divider 27 and the post-frequency divider 22 are placed before and after the comparator 20.

If no pre-frequency divider 27 is included, only one of the period of the measurement target current Is can be measured by such a superconductor sampler. However, when the pre-frequency divider 27 of a division factor n is placed before the comparator 20, the period of the trigger current Itr is rendered into 1/n and an n-period of the measurement target current Is can be measured by the superconductor sampler illustrated in FIG. 5.

In the example illustrated in FIG. 5, the pre-frequency divider 27 is located before the delay circuit 17 but may be located after the delay circuit 17.

According to the superconductor sampler according to the third embodiment of this invention, it is possible to measure the measurement target current Is at every period equal to (1/n) by locating the pre-frequency divider 27 before the comparator 20. The superconductor sampler can be realized which has low jitters, high speed and high precision characteristics, and which can be manufactured at a low cost. In addition, the measurement can be executed for a plurality of periods of the measurement target current Is.

Figure 6:
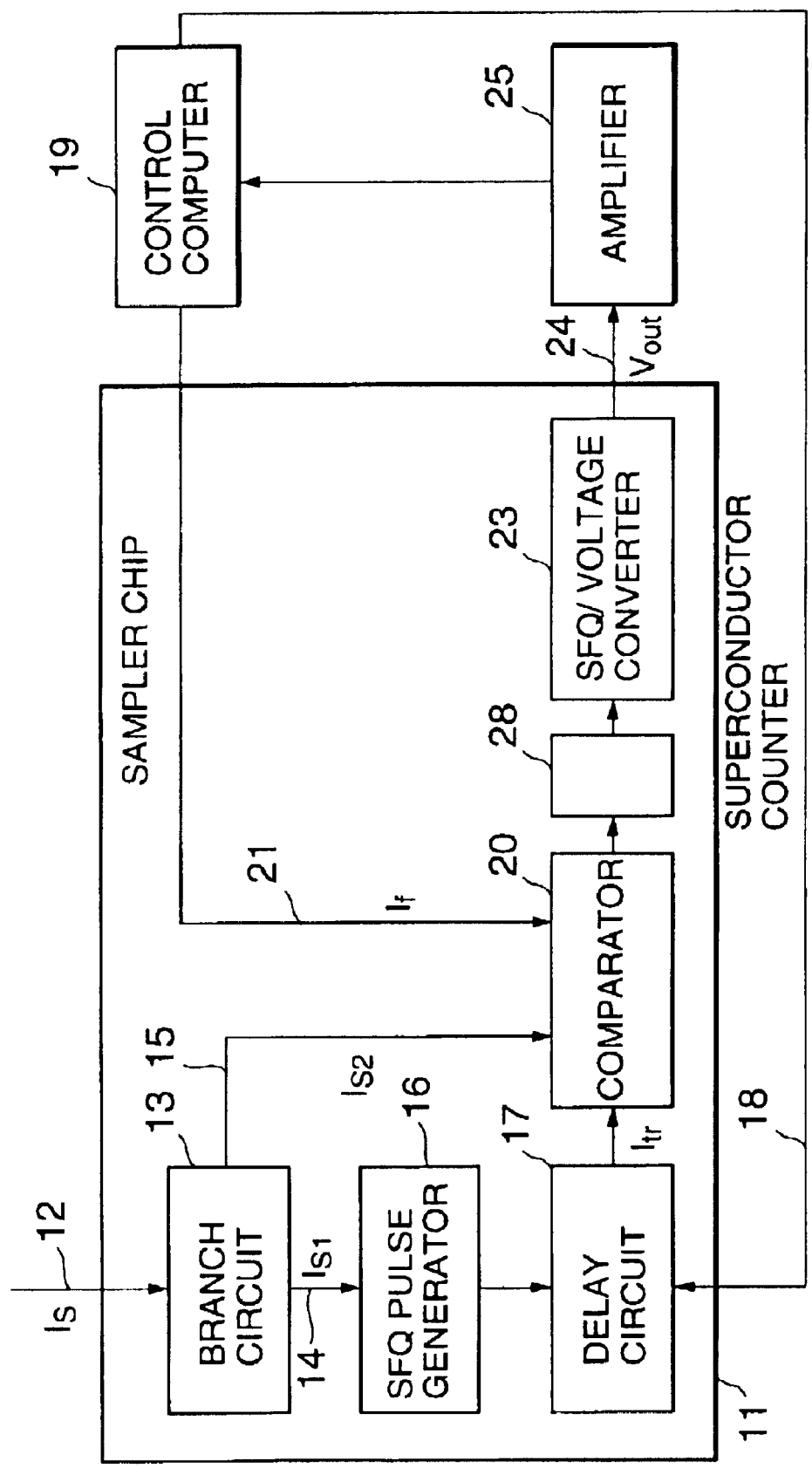
FIG. 6 shows a block diagram of a superconductor sampler according to a fourth embodiment of this invention.

Referring to FIG. 6, a superconductor sampler according to a fourth embodiment of this invention is similar in structure to that illustrated in FIG. 3 except that a superconductor counter 28 is included in a sampler chip 11c shown in FIG. 6, instead of the post-frequency divider 22 (FIG. 3). In this connection, the counter 26 (FIG. 3) in the room temperature atmosphere is omitted from FIG. 6.

The illustrated superconductor counter 28 has a plurality of output lines corresponding to a plurality of bits while each of the SFQ/voltage converter 23 and the amplifier 25 has a plurality of units, such as converter units, amplifier units, corresponding to the plurality of the output lines, respectively.

Using such a superconductor counter 28 makes it possible to count the SFQ pulses sent from the comparator 20 at a high speed. As mentioned before, the plurality of the bits are produced from the superconductor counter 28 as results of counting the SFQ pulses. This shows that accurate measurement can be carried out of switching times of the comparator 20 in comparison with the post-frequency divider 22 in which a single bit alone is generated. Therefore, the measurement accuracy can be improved as compared with FIG. 3.

According to the fourth embodiment, the superconductor counter 28 is included in lieu of the post-frequency divider 22, which brings about an increase of the output lines of the superconductor counter 28. As a result, it is possible to implement the superconductor sampler of not only low jitters, high speed, a low cost, but also high precision.

Figure 7:
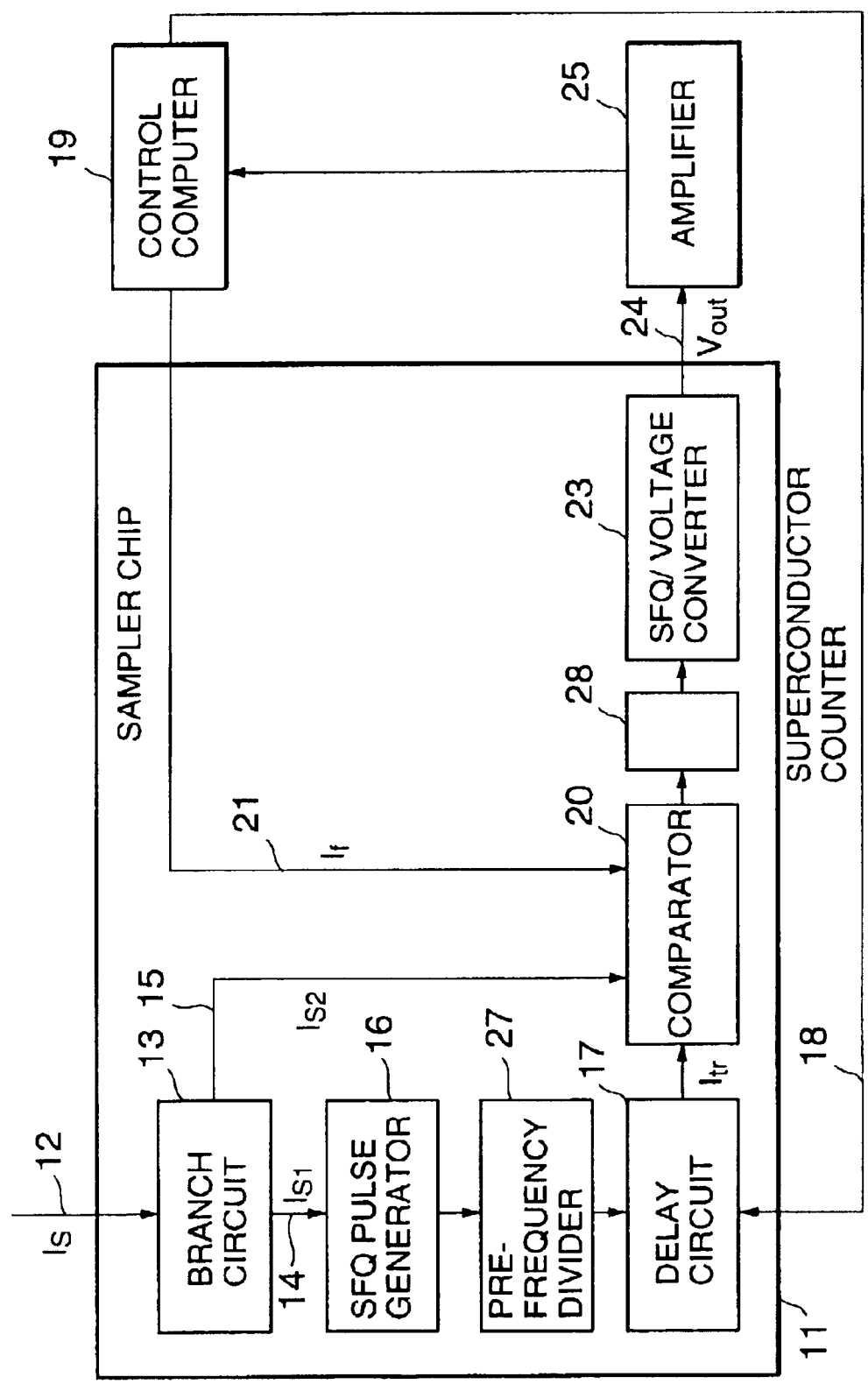
FIG. 7 shows a block diagram of a superconductor sampler according to a fifth embodiment of this invention.

Referring to FIG. 7, a superconductor sampler according to a fifth embodiment of this invention comprises similar parts designated by like reference numerals in FIGS. 3 through 6. Specifically, the superconductor sampler illustrated in FIG. 7 is similar to that illustrated in FIG. 5 except that the superconductor counter 28 is located in the sampler chip 11d instead of the post-frequency divider 22. This structure dispenses with the counter 26 (FIG. 3) that is placed in the room temperature atmosphere.

As mentioned in conjunction with the fourth embodiment, the superconductor counter 28 has a plurality of output lines which correspond to a plurality of bits and which also correspond to a plurality of converter units of the SFQ/voltage converter 23 and amplifier units of the amplifier 25.

Using such a superconductor counter 28 makes it possible to count the SFQ pulse sent from the comparator 20 at a high speed. The count results are produced by the superconductor counter 28 in the form of a plurality of bits. As mentioned before, this structure can accurately measure the switching times of the comparator 20, as compared with the post-frequency divider 22.

Although the pre-frequency divider 27 is placed before the delay circuit 17 in FIG. 7, it may be located after the delay circuit 17.

Thus, the superconductor sampler according to the fifth embodiment has the pre-frequency divider 27 before the comparator 20 and the superconductor counter 28 instead of the post-frequency divider 22. This structure is effective to increase the number of the output lines from the superconductor counter 28, to reduce measurement jitters and costs, and to operate not only at a high speed but also with a high precision.

Inner Structure of the Superconductor Sampler

Now, description will be directed to an inner structure of the superconductor sampler according to this invention. Herein, it is to be noted that the sampler chip 11b of the superconductor sampler illustrated in FIG. 5 will be described as an example and has both the pre-frequency divider 27 and the post-frequency divider 22.

Figure 8:
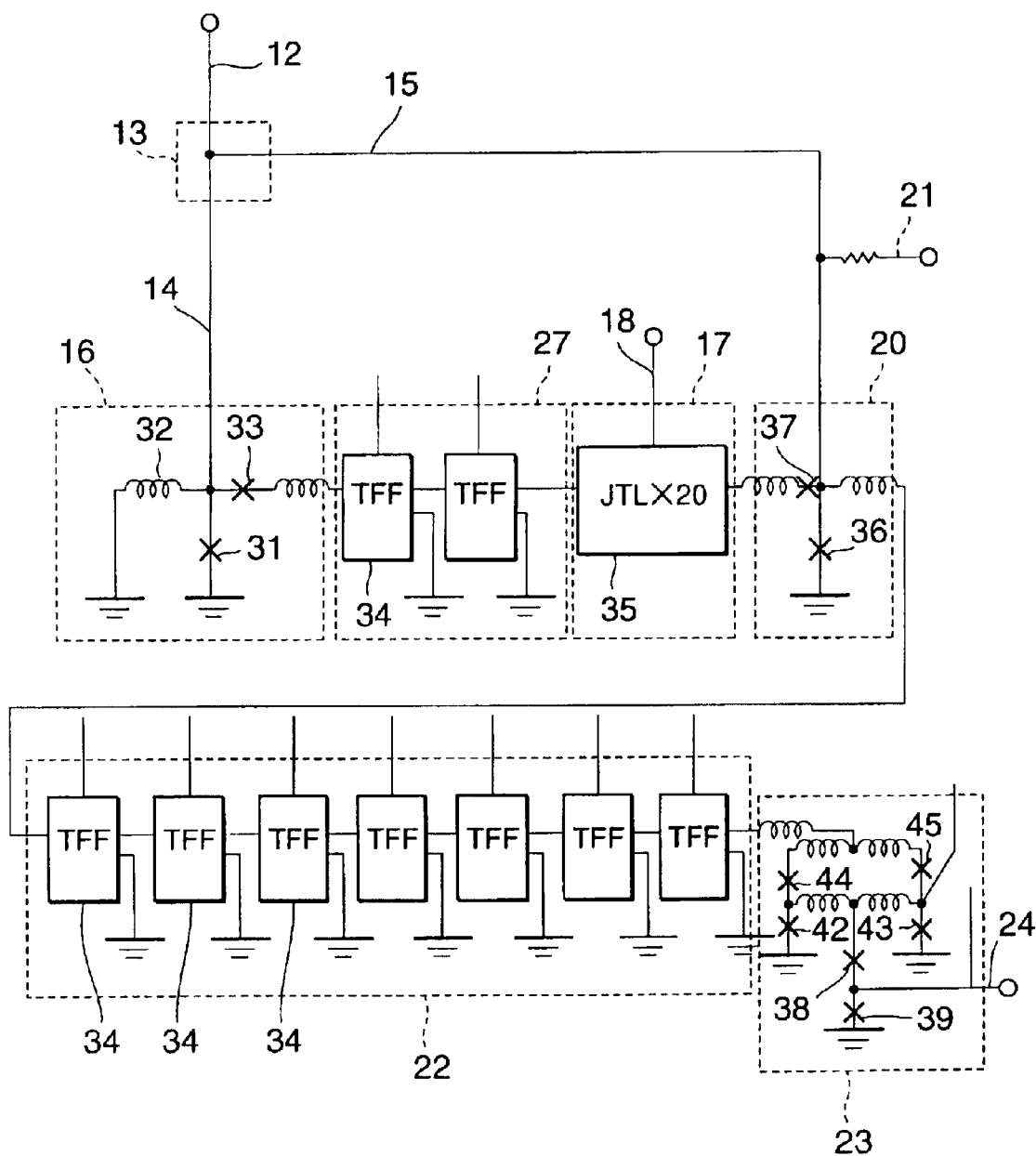
FIG. 8 specifically shows a circuit diagram of the superconductor sampler illustrated in FIG. 5.

Referring to FIG. 8, the illustrated superconductor sampler comprises similar parts designated by like reference numerals. In FIG. 8, it is assumed that the superconductor sampler is given, as the measurement target current Is, a digital signal of 40 Gbps that is used in optical communication and that is attenuated by an outside fixed attenuator (not shown) to a predetermined value or magnitude of, for example, 0.6 mA. It is also surmised that the digital signal alternately repeats a logic "0" and a logic "1" in the form of "101010" (binary pattern) and repeatedly takes 0.6 mA and 0 mA at a period of 20 GHz.

As illustrated in FIG. 8, the digital signal is delivered through the first input line 12 to the branch circuit 13. The first input line 12 is bifurcated into a first current path 14 and a second current path 15. As illustrated in FIG. 8, the branch circuit 13 serves to branch or bifurcate the first input line 12 into the first and the second current paths 14 and 15.

When the first and the second current paths 14 and 15 have the same impedance, the measurement target current Is is equally divided into the first current Is1 and the second current Is2.

The SFQ pulse generator 16 illustrated in FIG. 8 has two Josephson junctions 31 and 33 depicted by crisscrosses and an inductance 32. The first current Is1 is supplied to the Josephson junction 31 that has a critical current value of 0.2 mA and that serves to generate a SFQ pulse. In this connection, the Josephson junction 31 may be called a first Josephson junction for generating the SFQ pulse.

When the first current Is1 exceeds the critical current value, the first Josephson junction 31 is switched on. As a result, an SFQ is entered counterclockwise into a superconducting loop that includes the inductance 32 for avoiding re-switching operation while an SFQ is also entered clockwise into a superconducting loop that includes the second Josephson junction 32 for generating the SFQ pulse.

Herein, it is assumed that the superconducting loop including the second Josephson junction has inductance of 5 pH while the second Josephson junction has a critical current value of 0.2 mA. In this case, a current of 0.4 mA is ready to be caused to flow through this loop when the SFQ is entered. Under the circumstances, the second Josephson junction 33 is switched on when the current rises up, because the critical current value of the second Josephson junction 33 is equal to 0.2 mA. The resultant SFQ exits from the loop and brings about a rapid reduction of the current that flows through the second Josephson junction 33. Thus, a current of a pulse shape is caused to flow as the SFQ pulse through the loop.

The illustrated inductance 32 has an inductance value of 4 pH and is operable to prevent the first Josephson junction 31 from being switched on again by causing the current to flow into the first Josephson junction 31 after the second Josephson junction 33 is switched on.

When the measurement target current Is becomes 0 mA, an SFQ is entered into the superconducting loop including the inductance 32 and, as a result, a current of 0.4 mA is caused to flow through the first Josephson junction 31 in a reverse direction to the previous one. In consequence, the first Josephson junction is switched on and the SFQ is released.

In the illustrated example, the SFQ pulse generated in the above-mentioned manner is given to the pre-frequency divider 27. The pre-frequency divider 27 is structured by a series connection of two stages of superconductor toggle flip flops (TFF) 34. Each TFF 34 produces a single output signal in response to two input signals.

Figure 9:
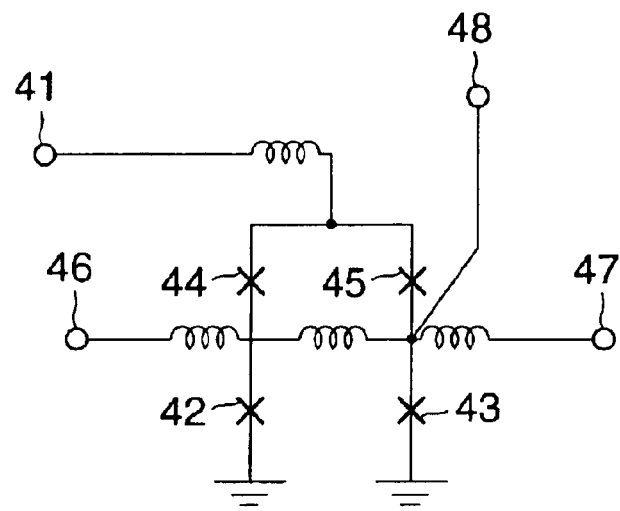
FIG. 9 shows a circuit diagram of a superconductor toggle flip flop (TFF) used in FIG. 8.

Such a TFF 34 that acts as an elementary component is exemplified in FIG. 9. The TFF illustrated in FIG. 9 is similar in structure and operation to that mentioned in IEEE Transactions on Applied Superconductivity (Vol. 1, No.1, March, 1991, page 3). In FIG. 9, an SFQ pulse is given from an input terminal 41 and is caused to flow into first and second TFF junctions 42 and 43.

It is assumed that a current value of the input SFQ pulse is equal to 0.2 mA while each critical current value of the first and the second TFF junctions 42 and 43 is equal to 0.3 mA. In this event, both the first and the second TFF junctions 42 and 43 are not switched on by supply of the input SFQ pulse alone.

In this situation, an SFQ is held or kept counterclockwise in a superconducting loop that includes the first and the second TFF junctions 42 and 43 and is assumed to have a current value of 0.2 mA. In this event, the first TFF junction 42 sums up currents resulting from the input SFQ and the held SFQ. In consequence, the first TFF junction 42 is switched on and produces an SFQ pulse from a first output terminal 46 while an SFQ is held clockwise within a superconducting loop including the first and the second TFF junctions 42 and 43.

When the first TFF 42 is switched on, the SFQ pulse that flows through the first TFF junction 42 is caused to flow into a current path including the second TFF junction 43. However, it is possible to prevent the second TFF junction 43 from being switched on, by switching a fourth TFF junction 45 on before the second TFF junction 43 is switched on.

When a next following input signal is given from the input terminal 41 with a clockwise SFQ pulse held, currents caused by the input SFQ pulse and the held SFQ are summed up by the second TFF junction 43. The resultant second TFF junction 43 is switched to supply an SFQ pulse current to a second output terminal 47 and to hold a counterclockwise SFQ within the superconducting loop including the first and the second TFF junctions 42 and 43.

When the second TFF junction 43 is switched on, the SFQ pulse current that flows through the second TFF junction 43 is caused to flow into the first TFF junction 42. In this event, the first TFF junction 42 is not switched on because the third TFF junction 44 is switched on before the first TFF junction 42 is switched on.

In the TFF circuit illustrated in FIG. 9, a single SFQ pulse is produced from either output terminal each time when two of the input SFQ pulses are given through the input terminal 41. This shows that the illustrated TFF circuit forms a frequency divider that has a division factor of two. In the illustrated example, the TFF circuit has a bias input terminal 48.

Turning back to FIG. 8, the pre-frequency divider 27 has two of the TFF circuits that are illustrated in FIG. 9 and that are connected in series to each other. As a result, the pre-frequency divider 27 serves as a one-fourth (¼) frequency division circuit with a division factor of four. Therefore, the input digital signal of 20 GHz is frequency-divided into 5 GHz by the pre-frequency divider 27. The pre-frequency divider 27 produces a single SFQ pulse per four periods or cycles of the measurement target current Is. This means that the SFQ pulse makes it possible to measure the measurement target current Is over four periods.

In FIG. 8, the SFQ pulse which is produced by the pre-frequency divider 27 is sent to the delay circuit 17. As the delay circuit 17 is used a Josephson transmission line (JTL) that is similar in structure to that described on the above-mentioned reference (IEEE Transactions on Applied Superconductivity Vol.1, No.1, March, 1991, pages 3 to 28).

Figure 10:
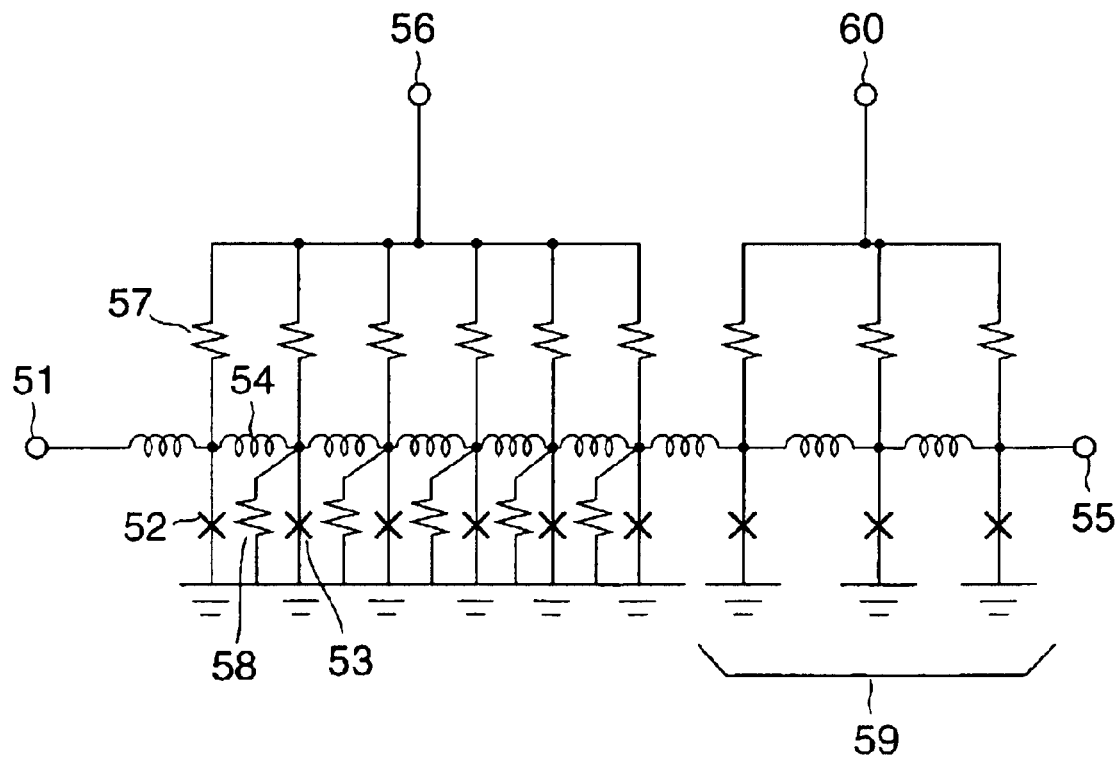
FIG. 10 shows a circuit diagram of a Josephson transmission line (JTL) of five stages illustrated in FIG. 8.

Referring to FIG. 10, illustration is made of the delay circuit 17 structured by five stages of the JTLs. Specifically, each JTL is formed by a superconducting loop including a Josephson junction and is connected to one another in the illustrated manner to provide the delay circuit 17. Each superconducting loop is featured in that a product of a critical current value Ic of each Josephson junction and inductance L of each loop is smaller than a flux quantum. Typically, Ic=0 and L=4 pH.

In the delay circuit 18 illustrated in FIG. 10, when an SFQ pulse is supplied from an input terminal 51, a first JTL junction 52 is turned on. As a result, the SFQ is entered into a superconducting loop formed by the first JTL junction 52, a second JTL junction 53, and first JTL inductance 54.

As mentioned before, a product of the L×Ic is smaller than the flux quantum and, therefore, the SFQ can not be held within this loop. In consequence, a second superconducting loop is switched on and the SFQ is entered into the second superconducting loop. A similar operation is repeated and the SFQ is propagated towards an output terminal 55.

As described in "Applied Physics Letters" (Vol.76, No.25, page 3820, 19 Jun. 2000), it is known that a propagation time of an SFQ pulse in a JTL can be controlled by a bias current. Taking this into consideration, the propagation time of the SFQ in the JTL, namely, a delay time of the SFQ can be controlled in the illustrated delay circuit 17 by controlling a bias current given from a bias input terminal 56.

In FIG. 10, JTL resistors 57 are connected between the bias input terminal 56 and the respective JTL junctions, such as 52, 53. Such JTL resistors 57 serves to alleviate an adverse influence to any other JTL junctions when each JTL junction is switched on.

In the superconductor sampler illustrated in FIG. 8, the delay circuit 17 is structured by twenty-stages of the JTLs 35. Each stage of the JTLs has a delay time of 10 picoseconds in maximum and, as a result, the illustrated delay circuit 17 gives a maximum delay time of 200 picoseconds because it has the twenty stages of the JTLs. This delay time corresponds to the four periods of cycles of the measurement target current Is.

The delay time of the delay circuit 17 illustrated in FIG. 8 is controlled by controlling the bias current of the JTLs given through a delay control line 18 from the control computer 19.

In order to carry out measurement of a high time resolution by the use of the superconductor sampler, it is preferable that the product of the critical current Ic in the Josephson junction and the normal resistor Rn is as large as possible. However, such a JTL which uses a Josephson junction of a large product of IcRn narrows a width of a propagated SFQ pulse. This results in shortening a delay time controlled by the bias current.

Figure 11:
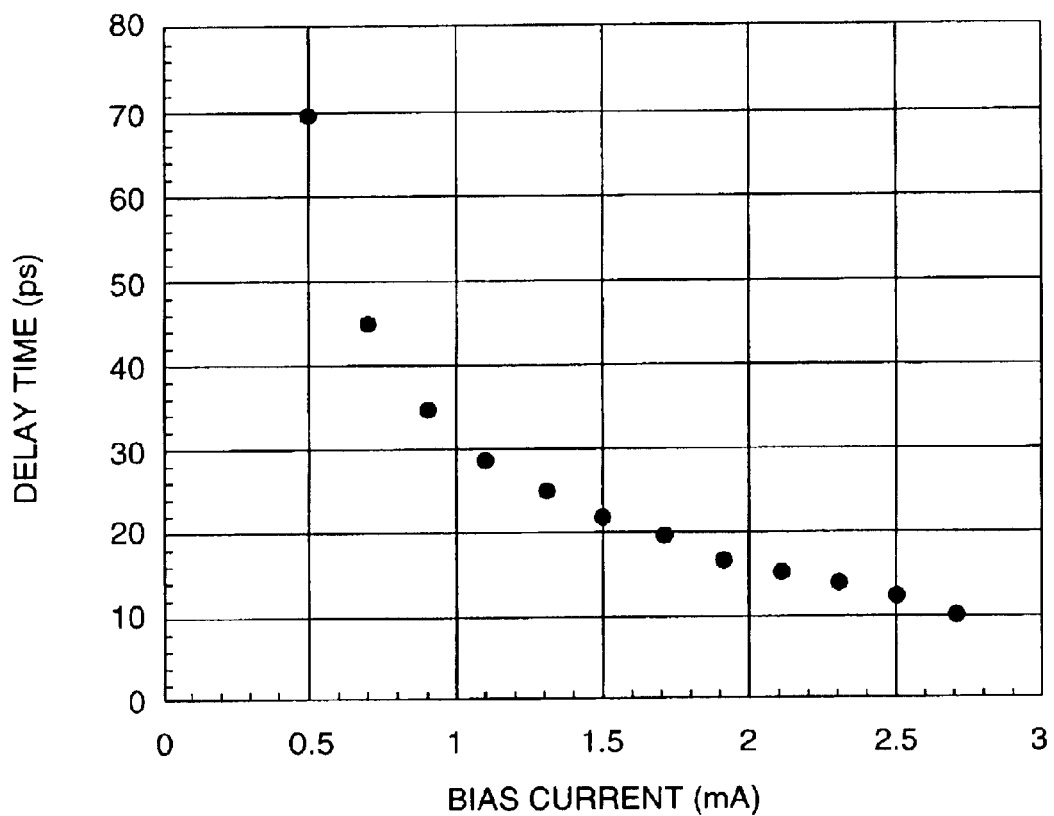
FIG. 11 shows a simulation result of a JTL of ten stages and represents a relationship of between a bias current and a delay time.

Referring FIG. 11, a relationship between a bias current and a delay time of the JTL circuit is shown as a simulation result on the conditions that the JTL circuit has ten stages of JTLs each of which has a Josephson junction having the IcRn product of 0.7 mV. In other words, a bias current dependency of a delay time is illustrated in FIG. 11. From FIG. 11, it is understood that the delay time is controlled by the bias current only by about 20 picoseconds (from 10 ps to 30 ps) in a region in which the delay time is linearly varied in relation to the bias current. Therefore, one hundred stages of the JTL are needed to obtain the delay time of, for example, 200 picoseconds. In order to cope with this problem, the JTL illustrated in FIG. 10 has a shunt resistor 58 (Rs) to shunt the Josephson junction 53.

Figure 12:
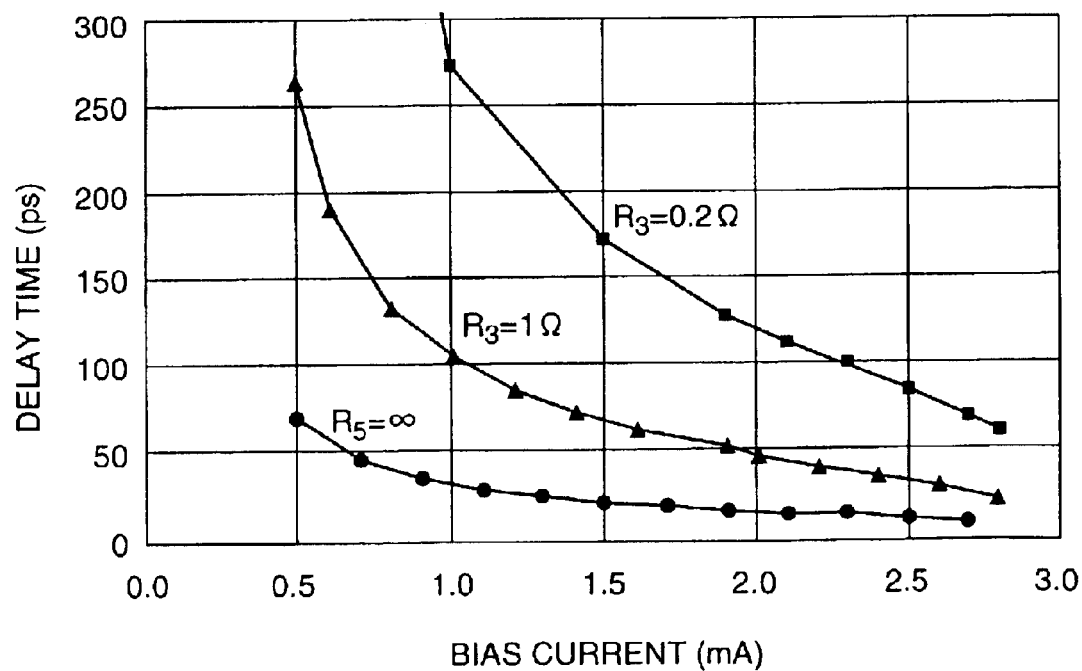
FIG. 12 shows that simulation results which appear when shunt resistors are varied from one to another and which represent the relationship between the bias current and the delay time.

Referring to FIG. 12, a bias current dependency of a delay time is shown by curves C1 to C3 as simulation results. In FIG. 12, the curve C1 shows the simulation result obtained when the shunt resistor Rs is not connected, namely, Rs=∞ while the curves C2 and C3 show the simulation results obtained when Rs=1Ω and Rs=0.2Ω. In this event, the product of IcRn is assumed to be equal to 0.7 mV.

This shows that it is possible to lengthen the delay time controlled by the bias current, as shown in FIG. 12, by connecting the shunt resistor 58 of a shunt resistance Rs to the Josephson junction and by reducing the product of IcRn. For example, connecting the shunt resistor 58 of 0.2Ω serves to obtain the delay time of about 100 picoseconds when a linearly variable region of the delay time relative to the bias current is used in the ten stages of the JTLs. Accordingly, a delay time of 200 picoseconds can be completely realized by the use of twenty stages of the JTLs. This is very effective to remarkably reduce a size of the delay circuit 17.

On the other hand, the SFQ pulse that propagates the JTLs with the shunt resistors 58 becomes wide in pulse width because each product of the IcRn in each Josephson junction is equivalently lowered and, as a result, this structure may not be suitable for measurement of high time resolution. Taking this into account, the delay circuit 17 illustrated in FIG. 10 has the JTLs with the shunt resistors 58 and second JTLs without any shunt resistor arranged between comparator junctions, as will be described later. This structure serves to shape the SFQ pulse and to render the pulse width of the SFQ pulse into an original pulse width.

Referring back to FIG. 10, the second JTL 59 is given a bias current from a second bias input terminal 60 different from the bias input terminal 56 for controlling the delay time. The second JTL 59 is also operable as a buffer that serves to prevent a variable current from flowing from the bias input terminal 56 into the comparator junction 36.

In FIG. 8, the SFQ pulse generated from the delay circuit 17 is given to the comparator 20. The comparator 20 is formed, for example, by the comparator junction 36 composed of a single Josephson junction and a current pulse generating junction 37. The current pulse generating junction 37 has a critical current value of 0.2 mA and is switched in response to the SFQ pulse to supply a pulse shaped current to the comparator junction 36.

The comparator junction 36 has a high critical current value of 0.5 mA and is not switched by the pulse shaped current alone. As shown in FIG. 8, the comparator junction 36 is given the feedback current If and the second current Is2 from the feedback current path 21 and the second current path 15, respectively.

When the SFQ pulse is supplied as the trigger current Itr from the delay circuit 17 to the comparator junction 36, the three currents, namely, the feedback current If, the second current Is2, and the trigger current Itr are summed up and given to the comparator junction 36 as a summed up current. When the summed up current exceeds the critical current value of the comparator junction 36, the comparator junction 36 is switched to generate a single SFQ pulse.

On the other hand, when the summed up current is smaller than the critical current value, the comparator junction 36 is not switched and generates no SFQ pulse.

The SFQ pulse, namely, the SFQ pulse current generated by the comparator 20 is sent to the post-frequency divider 22. The post-frequency divider 22 is formed, for example, by seven stages of TFFs 34 each of which has a structure illustrated in FIG. 9 and which is connected in series to one another. In this event, such a series connection of the seven TFFs 34 is practically obtained by connection a first output terminal 46 of a prior stage to an input terminal 41 of a next stage. The seven stages of the TFFs 34 have a division factor of 128 and are therefore operable to frequency-divide the SFQ pulse given from the comparator 20 into 1/128. As a result, an SFQ pulse that is output from the post-frequency divider 22 has a maximum frequency of 39 MHz.

The SFQ pulse is supplied from the post-frequency divider 22 to the SFQ/voltage converter 23, as shown in FIG. 8. The SFQ/voltage divider 23 may be, for example, a SFQ/DC converting circuit disclosed in the above-mentioned reference "IEEE Transactions on Applied Superconductivity".

As illustrate in FIG. 8, the SFQ/voltage converter 23 has first and second converting junctions 38 and 39 and any other elements that are connected in a manner similar to the TFF illustrated in FIG. 9 and that are represented by the same reference numerals. With this structure, each time when a single SFQ pulse is given, a superconducting loop including the first and the second TFF junctions 42 and 43 alternately holds clockwise and counterclockwise SFQ.

The first and the second converting junctions 38 and 39 constitutes an SQUID (superconducting quantum interference device) having an asymmetrical inductance. In this connection, when the clockwise SFQ is held, a voltage is developed at a point of connection between the first and the second converting junctions 38 and 39. However, when the counterclockwise SFQ is held, the voltage at the point of connection becomes zero. As shown in FIG. 8, the output line 24 of the SFQ/voltage converter 23 is derived from the point of connection between the first and the second converting junctions 38 and 39 and is alternately supplied with zero and the predetermined output voltage Vout each time when a single SFQ pulse is given to the SFQ/voltage converter 23. A typical value of the output voltage Vout is 0.2 mV or so.

Herein, it is noted that the output voltage Vout should be amplified more than 100 times in order to process the output voltage Vout by the use of a semiconductor device in the room temperature atmosphere. However, the frequency of the output voltage Vout is lowered to about 39 MHz and can therefore be amplified by a usual semiconductor amplifier used in the room temperature atmosphere.

The amplified output voltage Vout is counted by the counter 26 located in the room temperature atmosphere. During a predetermined counting time, trials of the comparator 20 are repeated, for example, 100,000 times and the amplified voltage Vout is counted during the predetermined counting time. In other words, occurrence of the amplified voltage is counted by the counter 26 during the predetermined counting time. It is possible to reduce an influence of noise, such as thermal noise and the like, by carrying out the counting operation while the trials in the comparator 20 are repeated many times.

When variations of the output voltage Vout are counted, for example, 500 times or more, the control computer 19 judges that the comparator 20 is switched.

In the example illustrated in FIG. 8, the comparator 20 carries out measurement at every one of four periods in response to the input signal of 20 GHz and judgement related to switching is made each time when the comparator 20 operates 100,000 times. Therefore, the feedback current If may be switched by a frequency of 50 KHz.

At any rate, such an operation is for detecting a minimum feedback current If at which the comparator 20 is switched. Herein, it is assumed that such a minimum feedback current If is detected by changing the value of the feedback current If 50 times on the average. In this case, the bias given to the delay circuit 27 may be switched by the use of a frequency of 1 KHz.

Accordingly, control operation of the feedback current If and the delay time can be fully executed by using a semiconductor device operable in the room temperature atmosphere. Practically, four cycles or periods of the digital waveform of "101010 . . . " given at 40 GHz can be observed within one second by sampling 1000 points. Specifically, inasmuch as one cycle or period of 40 GHz is equal to 25 picoseconds, four cycles of 40 GHz are equal to 100 picoseconds and are successively delayed by 0.1 picosecond by the delay circuit 27. As a result, the digital waveform is sampled 1000 times for 100 picoseconds.

As mentioned in conjunction with FIG. 5, the delay circuit 17 and the pre-frequency divider 27 illustrated in FIG. 8 may be substituted in position to each other. The post-frequency divider 22 (FIG. 8) may be replaced by the superconducting counter 28 like in FIGS. 6 and 7.

Figure 13:
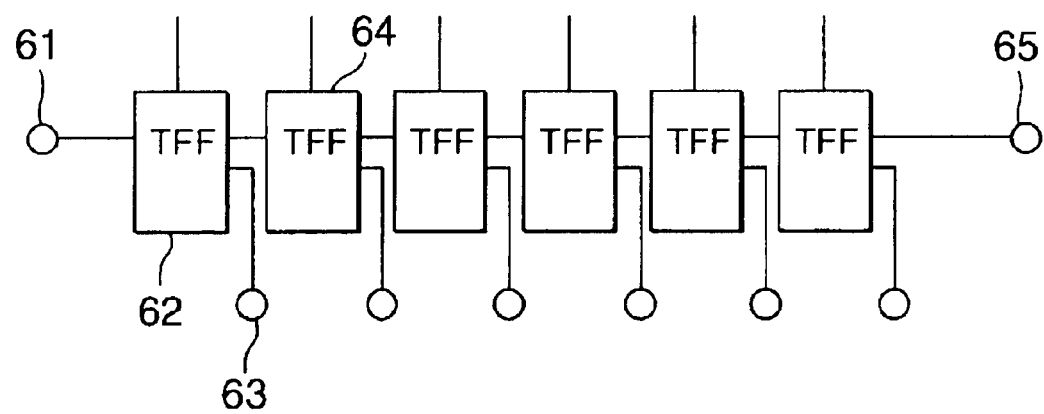
FIG. 13 shows a block diagram of a superconductor counter structured by a superconductor TFF.
Figure 14:
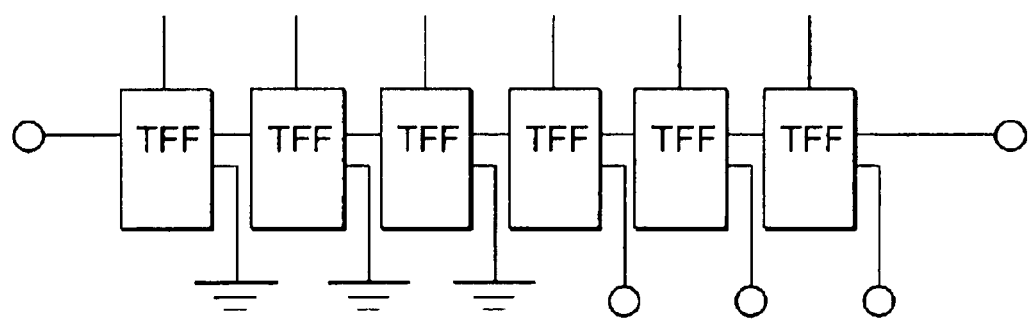
FIG. 14 shows a block diagram of another superconductor counter which serves to output only an upper part of four bits.

Referring to FIG. 13, an example of the superconducting counter 28 is illustrated which uses the superconducting TFF illustrated in FIG. 9.

The superconducting counter 28 is different from the frequency divider shown in FIG. 8 in that the superconducting counter 28 has a plurality of output terminals derived from each stage of the superconducting TFFs 62, 64, although the frequency divider has the single output terminal connected to the last stage of the superconducting TFFs.

In the superconducting counter illustrated in FIG. 13, an SFQ pulse is given through an input terminal 61 to the first stage of the TFF to be output as a first bit to a first one 63 of the output terminal. Next, the output terminal of the input SFQ pulse is switched from the first TFF 62 to the second TFF 64. This operation is repeated to count the input SFQ in a binary manner.

Using the above-mentioned superconducting counter 28 enables to precisely count the switching times of the comparator 20 and to improve the measuring precision.

In order to output each bit of the superconducting counter 28, each of the SFQ/voltage converters 23 and the amplifiers 25 has a plurality of units corresponding to the respective bits, as mentioned before. Therefore, the numbers of parts are inevitably increased so as to output all bits. In addition, frequencies become high as significant bits become low, which makes amplification difficult by the amplifiers used in the room temperature atmosphere.

In spite of the above-mentioned fact, it is to be noted that upper bits are practically important in the measurement and all bits from the most significant bit to the least one are not always needed. Taking this into consideration, the upper bits may be selected with the lower bits omitted.

Referring to FIG. 13, a superconducting counter is illustrated which outputs only four upper bits through four output terminals extracted from three of the TFFs. Using the illustrated superconducting counter serves to reduce a frequency band of the amplifier 25 to 320 MHz at maximum.

The above-mentioned superconductor sampler can be manufactured by using a metal superconductor, such as niobium, niobium nitride.

Furthermore, an oxide superconductor, such as $YBa_2Cu_3Ox$, or the like, may be used to form the superconductor sampler and is helpful to raise an operation temperature to more than 30K. As a result, the superconductor sampler becomes simple in a cooling system and is therefore more inexpensive and easy in handling.

As mentioned before, the superconductor sampler according to this invention generates the trigger current Itr on the sampler chip on the basis of the measurement target current. Inasmuch as the trigger current is based on the measurement target current, it is possible to minimize fluctuation of arrival time of the trigger current and deterioration of its rise time and, as a result, to reduce jitters.

Thus, the trigger current Itr for determining the measurement timing is produced on the sampler chip by the use of the branch circuit and the like. This structure is effective to decrease the jitters, to increase the measurement frequency, and to reduce costs.

According to another aspect of this invention, superconducting elements, such as the superconducting counter, are used to execute a delay operation of the trigger current Itr and initially processing. This structure serves to considerably improve the measurement frequency and the measurement precision and to shorten the measurement time.

According to still another aspect of this invention, high frequency parts are formed by superconductor elements and can therefore reduce costs, as compared with using high frequency parts of high costs.

Moreover, the shunt resistors are connected to the Josephson junctions so as to reduce the product of the current and the resistor. This results in an increase of a delay time controlled by the bias current and accomplishes a desired delay time by a small number of stages of JTLs. As a result, it is possible to favorably reduce a circuit size.

What is claimed is:

1. A sampler for use in measuring a waveform of an electric signal given as a measurement target signal, comprising:
   branch means for branching the measurement target signal into first and second currents;
   generating means for generating a single flux quantum (SFQ) pulse in response to the first current;
   pre-frequency dividing means for frequency-dividing the SFQ pulse into a frequency-divided pulse;
   delay means for delaying the frequency-divided pulse by a controllable delay time to produce a frequency-divided and delayed pulse as a trigger current;
   comparing means, responsive to the trigger current, the second current, and a feedback current, for conducting a switching operation in accordance with values of the second and the feedback currents each time when the trigger current is given, to produce an output pulse; and
   voltage converting means for converting the output pulse produced by the comparing means into a converted voltage;
   the waveform of the electric signal being measured on the basis of the converted voltage.

2. A sampler as claimed in claim 1, wherein the branch means, the SFQ generating means, the delay means, the comparing means, the pre-frequency dividing means, the voltage converting means constitute a sampler circuit and are formed in a single chip.

3. A sampler as claimed in claim 2, wherein the pre-frequency dividing means is structured by SFQ toggle flip flops (TFF).

4. A sampler as claimed in claim 3, wherein a whole or a part of the branch means, the SFQ pulse generating means, the delay means, the comparing means, and the pre-frequency dividing means is constituted by a superconductor.

5. A sampler as claimed in claim 4, wherein the superconductor is an oxide superconductor.

6. A sampler as claimed in claim 1, wherein the delay means comprises a Josephson transmission line (JTL) which includes a plurality of Josephson junctions and shunt resistors for shunting the Josephson junctions and which controls a propagation speed of the SFQ pulse by a bias current.

7. A sampler as claimed in claim 6, wherein the shunt resistors have resistances smaller than a normal resistance of each Josephson junction.

8. A sampler as claimed in claim 7, wherein an additional JTL without any shunt resistor is disposed between the JTL with the shunt resistors and the comparing means.

9. A sampler as claimed in claim 6, wherein a whole or a part of the branch means, the SFQ pulse generating means, the delay means, the comparing means, and the pre-frequency dividing means is constituted by an oxide superconductor.

10. A sampler as claimed in claim 1, wherein the comparing means includes a Josephson junction.

11. A method of measuring a waveform of an electric signal given as a measurement target current, comprising the steps of:
    branching the measurement target current into first and second currents;
    generating an SFQ pulse in response to the first current;
    frequency-dividing the SFQ pulse into a frequency-divided pulse;
    controlling a propagation time of the frequency-divided pulse to produce a controlled frequency-divided pulse as a trigger pulse;
    receiving the trigger current, the second current, and a feedback current to conduct a switching operation in accordance with values of the second and the feedback current on reception of the trigger current and to produce an output pulse as a result of the switching operation;
    converting the output pulse into a corresponding voltage;
    successively counting the SFQ pulse for a predetermined duration on the basis of the corresponding voltage;
    repeating the above-mentioned steps with the propagation time successively varied.

12. A sampler for use in measuring a waveform of a measurement target current by sampling the measurement target current by a trigger current, comprising:
    branching means, responsive to the measurement target current, for branching the measurement target current into a first current used as the trigger current and a second current representative of the measurement target current; and
    processing means for processing the first and the second currents to measure the waveform of the measurement target current, wherein both the branching means and the processing means are formed in a sampler chip kept in a superconducting atmosphere and the processing means is supplied with a controllable feedback current outside of the sampler chip, said processing means comprising:
      trigger current generating means for generating the trigger current in response to the first current, comprising:
        SFQ pulse generating means for generating an SFQ pulse in response to the first current;
        delay means for delaying the SFQ pulse by a controllable delay time to produce a delayed SFQ pulse as the trigger pulse,
        pre-frequency dividing means for frequency-dividing eather the SFQ pulse or the delayed SFQ pulse into a frequency-divided SFQ pulse; and
        means for producing the frequency-divided SFQ pulse as the trigger current;
      comparing means, having a predetermined threshold level, for comparing a sum of the trigger, the second, and the feedback currents with the predetermined threshold level to produce an output signal representative of a result of comparison; and
      output means for outputting the output signal to measure the waveform of the measurement target current outside of the sampler chip.

13. A sampler as claimed in claim 12, wherein the output means comprises converting means for converting the output signal into a voltage signal processed outside of the sampler chip.

14. A method of measuring a waveform of a measurement target current by sampling the measurement target current by a trigger current, comprising the steps of:
    branching the measurement target current into a first current used as the trigger current and a second current representative of the measurement target current;
    processing the first and the second currents to measure the waveform of the measurement target current, wherein both the branching and the processing steps are carried out in a sampler chip kept in a superconducting atmosphere, wherein processing step comprises;

generating the trigger current in response to the first current, wherein the trigger current generating step comprises:
  generating an SFQ pulse in response to the first current;
  delaying the SFQ pulse by a controllable delay time to produce a delayed SFQ pulse as the trigger pulse; and
  frequency-dividing either the SFQ pulse or the delayed SFQ pulse into a frequency-divided SFQ pulse; and
  producing the frequency-divided SFQ pulse as the trigger current;
comparing a sum of the trigger, the second, and the feedback currents with a predetermined threshold level to produce an output signal representative of a result of comparison; and
outputting the output signal to measure the waveform of the measurement target current outside of the sampler chip.

15. A method as claimed in claim 14, wherein the outputting step comprises the step of converting the output signal into a voltage signal processed outside of the sampler chip.

* * * * *